(12) United States Patent
Kim et al.

(10) Patent No.: US 11,626,372 B2
(45) Date of Patent: *Apr. 11, 2023

(54) METAL-FREE FRAME DESIGN FOR SILICON BRIDGES FOR SEMICONDUCTOR PACKAGES

(71) Applicant: Intel Corporation, Santa Clara, CA (US)

(72) Inventors: Dae-Woo Kim, Phoenix, AZ (US); Sujit Sharan, Chandler, AZ (US); Sairam Agraharam, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 116 days.

This patent is subject to a terminal disclaimer.

(21) Appl. No.: 17/143,142

(22) Filed: Jan. 6, 2021

(65) Prior Publication Data

US 2021/0125942 A1    Apr. 29, 2021

Related U.S. Application Data

(63) Continuation of application No. 16/576,520, filed on Sep. 19, 2019, now Pat. No. 10,916,514, which is a
(Continued)

(51) Int. Cl.
*H01L 23/538* (2006.01)
*H01L 23/58* (2006.01)
(Continued)

(52) U.S. Cl.
CPC .......... *H01L 23/585* (2013.01); *G01R 31/275* (2013.01); *H01L 22/32* (2013.01);
(Continued)

(58) Field of Classification Search
CPC .. H01L 23/538; H01L 23/5381; H01L 23/544
See application file for complete search history.

(56) References Cited

U.S. PATENT DOCUMENTS

| 7,642,625 B2 | 1/2010 | Otsuki |
| 8,138,014 B2 | 3/2012 | Chi et al. |
(Continued)

FOREIGN PATENT DOCUMENTS

| JP | 20083114655 | 12/2008 |
| TW | 201140792 | 11/2011 |
(Continued)

OTHER PUBLICATIONS

Office Action from Taiwan Patent Application No. 109130417, dated Jul. 2, 2021, 6 pages, Search report in English translation.
(Continued)

*Primary Examiner* — Mark V Prenty
(74) *Attorney, Agent, or Firm* — Schwabe, Williamson & Wyatt, P.C.

(57) ABSTRACT

Metal-free frame designs for silicon bridges for semiconductor packages and the resulting silicon bridges and semiconductor packages are described. In an example, a semiconductor structure includes a substrate having an insulating layer disposed thereon, the substrate having a perimeter. A metallization structure is disposed on the insulating layer, the metallization structure including conductive routing disposed in a dielectric material stack. A first metal guard ring is disposed in the dielectric material stack and surrounds the conductive routing. A second metal guard ring is disposed in the dielectric material stack and surrounds the first metal guard ring. A metal-free region of the dielectric material stack surrounds the second metal guard ring. The metal-free region is disposed adjacent to the second metal guard ring and adjacent to the perimeter of the substrate.

18 Claims, 9 Drawing Sheets

Related U.S. Application Data continuation of application No. 15/749,744, filed as application No. PCT/US2015/058074 on Oct. 29, 2015, now Pat. No. 10,461,047.

(51) Int. Cl.

| | |
|---|---|
| *H01L 23/498* | (2006.01) |
| *H01L 23/544* | (2006.01) |
| *H01L 21/66* | (2006.01) |
| *H01L 23/00* | (2006.01) |
| *G01R 31/27* | (2006.01) |
| *H01L 23/522* | (2006.01) |
| *H01L 25/065* | (2023.01) |
| *H01L 25/18* | (2023.01) |

(52) U.S. Cl.
CPC ...... *H01L 23/49827* (2013.01); *H01L 23/522* (2013.01); *H01L 23/544* (2013.01); *H01L 24/14* (2013.01); *H01L 24/16* (2013.01); *H01L 24/17* (2013.01); *H01L 24/32* (2013.01); *H01L 24/73* (2013.01); *H01L 24/81* (2013.01); *H01L 24/92* (2013.01); *H01L 25/0655* (2013.01); *H01L 25/18* (2013.01); *H01L 2223/5442* (2013.01); *H01L 2223/54426* (2013.01); *H01L 2223/54453* (2013.01); *H01L 2224/04105* (2013.01); *H01L 2224/12105* (2013.01); *H01L 2224/14* (2013.01); *H01L 2224/1403* (2013.01); *H01L 2224/16145* (2013.01); *H01L 2224/16227* (2013.01); *H01L 2224/171* (2013.01); *H01L 2224/1703* (2013.01); *H01L 2224/17153* (2013.01); *H01L 2224/17177* (2013.01); *H01L 2224/32145* (2013.01); *H01L 2224/32225* (2013.01); *H01L 2224/73204* (2013.01); *H01L 2224/73253* (2013.01); *H01L 2224/73267* (2013.01); *H01L 2224/81132* (2013.01); *H01L 2224/81203* (2013.01); *H01L 2224/92125* (2013.01); *H01L 2924/1431* (2013.01); *H01L 2924/1434* (2013.01); *H01L 2924/15153* (2013.01); *H01L 2924/15192* (2013.01); *H01L 2924/15313* (2013.01); *H01L 2924/3512* (2013.01)

(56) References Cited

U.S. PATENT DOCUMENTS

| | | |
|---|---|---|
| 9,147,767 B2 | 9/2015 | Chen et al. |
| 9,966,304 B2 | 5/2018 | Lin et al. |
| 10,461,047 B2 | 10/2019 | Kim |
| 10,916,514 B2* | 2/2021 | Kim ............... H01L 23/544 |
| 2007/0102791 A1 | 5/2007 | Wu |
| 2008/0251923 A1* | 10/2008 | Wang ............... H01L 23/585 |
| | | 257/618 |
| 2008/0265378 A1 | 10/2008 | Lee et al. |
| 2010/0327424 A1 | 12/2010 | Braunisch et al. |
| 2011/0291267 A1 | 12/2011 | Wang et al. |
| 2012/0007211 A1 | 1/2012 | Aleksov et al. |
| 2014/0097861 A1 | 4/2014 | Okutsu et al. |
| 2014/0239455 A1 | 8/2014 | Ishii |
| 2015/0257316 A1 | 9/2015 | Lin et al. |
| 2018/0226364 A1 | 8/2018 | Kim |

FOREIGN PATENT DOCUMENTS

| | | |
|---|---|---|
| TW | 201145493 | 12/2011 |
| TW | 201501239 | 1/2015 |
| TW | 201532280 | 8/2015 |
| TW | 201539679 | 10/2015 |

OTHER PUBLICATIONS

International Preliminary Report on Patentability for International Patent Application No. PCT/US2015/058074 dated May 11, 2018, 10 pgs.

International Search Report and Written Opinion for International Patent Application No. PCT/US2015/058074 dated Jul. 27, 2016, 13 pgs.

Office Action from Taiwan Patent Application No. 105126641, dated Jan. 3, 2020, 5 pages.

Notice of Allowance from Taiwan Patent Application No. 105126641, dated Jun. 5, 2020, 3 pages.

Notice of Allowance from Taiwan Patent Application No. 109130417, dated Oct. 18, 2021, 3 pages, with English translation.

Office Action from German Patent Application No. 112015007261.6, dated Mar. 3, 2022, 5 pages.

* cited by examiner

METAL-FREE FRAME DESIGN FOR SILICON BRIDGES FOR SEMICONDUCTOR PACKAGES

CROSS-REFERENCE TO RELATED APPLICATION

This patent application is a continuation of U.S. patent application Ser. No. 16/576,520 filed Sep. 19, 2019, which is a continuation of Ser. No. 15/749,744, filed Feb. 1, 2018, which is a U.S. National Phase Application under 35 U.S.C. § 371 of International Application No. PCT/US2015/058074, filed Oct. 29, 2015, entitled "METAL-FREE FRAME DESIGN FOR SILICON BRIDGES FOR SEMICONDUCTOR PACKAGES," which designates the United States of America, the entire disclosure of which are hereby incorporated by reference in their entirety and for all purposes.

TECHNICAL FIELD

Embodiments of the invention are in the field of semiconductor packages and, in particular, metal-free frame designs for silicon bridges for semiconductor packages and the resulting silicon bridges and semiconductor packages.

BACKGROUND

Today's consumer electronics market frequently demands complex functions requiring very intricate circuitry. Scaling to smaller and smaller fundamental building blocks, e.g. transistors, has enabled the incorporation of even more intricate circuitry on a single die with each progressive generation. Semiconductor packages are used for protecting an integrated circuit (IC) chip or die, and also to provide the die with an electrical interface to external circuitry. With the increasing demand for smaller electronic devices, semiconductor packages are designed to be even more compact and must support larger circuit density. Furthermore, the demand for higher performance devices results in a need for an improved semiconductor package that enables a thin packaging profile and low overall warpage compatible with subsequent assembly processing.

C4 solder ball connections have been used for many years to provide flip chip interconnections between semiconductor devices and substrates. A flip chip or Controlled Collapse Chip Connection (C4) is a type of mounting used for semiconductor devices, such as integrated circuit (IC) chips, MEMS or components, which utilizes solder bumps instead of wire bonds. The solder bumps are deposited on the C4 pads, located on the top side of the substrate package. In order to mount the semiconductor device to the substrate, it is flipped over—the active side facing down on the mounting area. The solder bumps are used to connect the semiconductor device directly to the substrate.

Processing a flip chip is similar to conventional IC fabrication, with a few additional steps. Near the end of the manufacturing process, the attachment pads are metalized to make them more receptive to solder. This typically consists of several treatments. A small dot of solder is then deposited on each metalized pad. The chips are then cut out of the wafer as normal. To attach the flip chip into a circuit, the chip is inverted to bring the solder dots down onto connectors on the underlying electronics or circuit board. The solder is then re-melted to produce an electrical connection, typically using an ultrasonic or alternatively reflow solder process. This also leaves a small space between the chip's circuitry and the underlying mounting. In most cases an electrically-insulating adhesive is then "underfilled" to provide a stronger mechanical connection, provide a heat bridge, and to ensure the solder joints are not stressed due to differential heating of the chip and the rest of the system.

Newer packaging and die-to-die interconnect approaches, such as through silicon via (TSV), silicon interposers and silicon bridges, are gaining much attention from designers for the realization of high performance Multi-Chip Module (MCM) and System in Package (SiP). However, additional improvements are needed for such newer packaging regimes.

DESCRIPTION OF THE EMBODIMENTS

Figure 1A:
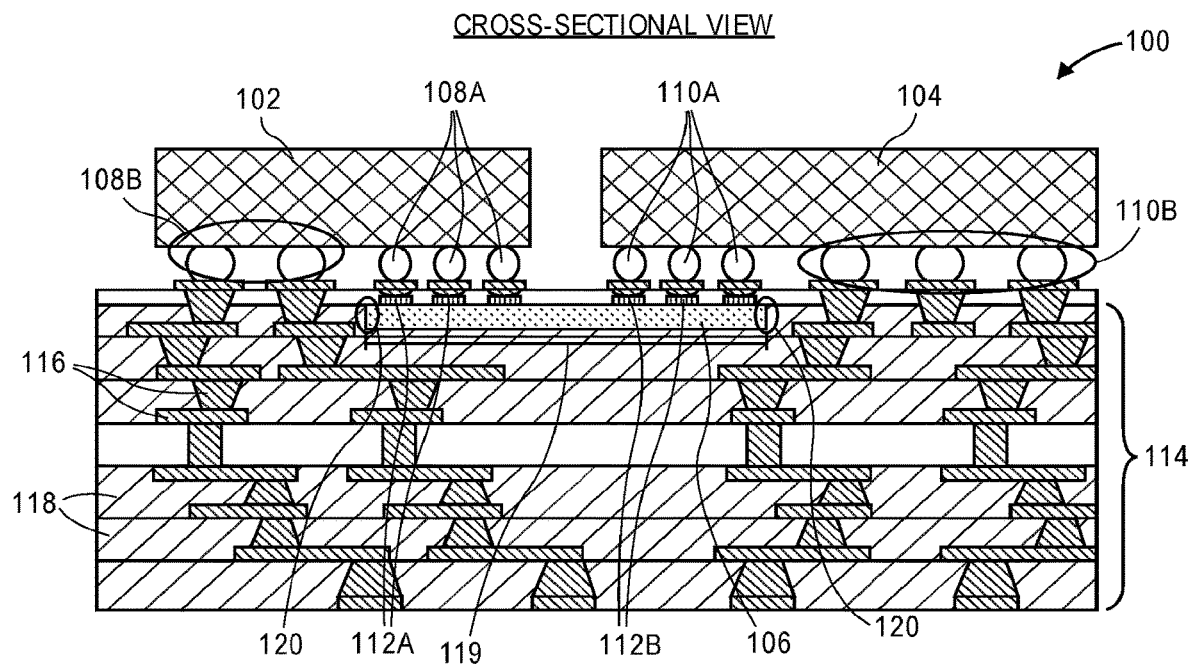
FIG. 1A illustrates a cross-sectional view of a semiconductor package having an Embedded Multi-die Interconnect Bridge (EMIB) connecting multiple dies, in accordance with an embodiment of the present invention.

Metal-free frame designs for silicon bridges for semiconductor packages and the resulting silicon bridges and semiconductor packages are described. In the following description, numerous specific details are set forth, such as packaging and interconnect architectures, in order to provide a thorough understanding of embodiments of the present invention. It will be apparent to one skilled in the art that embodiments of the present invention may be practiced without these specific details. In other instances, well-known features, such as specific semiconductor fabrication processes, are not described in detail in order to not unnecessarily obscure embodiments of the present invention. Furthermore, it is to be understood that the various embodiments shown in the Figures are illustrative representations and are not necessarily drawn to scale.

One or more embodiments described herein are directed to metal-free frame designs for silicon (Si) bridges. Applications may be particularly useful for so-called 2.5D packaging designs. As used throughout the term "silicon bridge" is used to refer to a die providing routing for two or more device dies. The term "Embedded Multi-die Interconnect Bridge (EMIB)" refers to the inclusion of such a silicon bridge die in a package substrate, or the resulting package.

To provide context, Embedded Multi-die Interconnect Bridge (EMIB) technology is being used and/or evaluated for applications such as the combination of high performance computing (HPC) with high bandwidth memory (HBM). Silicon bridge technology often involves the use of a very thick metal stack-up, typically totaling about 20 microns or more of metal to reduce electrical resistance otherwise associated with conventional signal routing. The silicon bridge dies may be fabricated from a wafer having a plurality of such dies thereon. As such, dicing of the wafer is necessary to singulate the silicon bridge dies. However, conventional use of a laser scribe process prior to a saw cut may not be possible for silicon bridge technology due to thick copper (Cu) metal layers present in the stack, including in the scribe lines of the wafer. Furthermore, it has proven very challenging to handle and cut ultra-thin silicon bridge wafers without an initial laser scribe. For example, removal of a laser scribe operation from the singulation process often leads to the formation of small die cracks.

Addressing one or more of the above described issues, embodiments described herein are directed to the fabrication and use of dual guard rings and a scribe line (street) metal free zone frame design. Such a design may be implemented to minimize and/or reduce die crack propagation. In an embodiment, such a frame design further involves separation of the two guard rings in the dual guard ring design in order to include staggered metal layer dummification between the two hermetic sealing guard rings. The overall design may be implemented to provide maximum protection for die crack propagation, particularly during singulation of a wafer having a plurality of silicon bridge dies.

To provide further context, conventional frame or (street) designs that are targeted to protect possible die crack propagation and moisture penetration often include the use of two guard rings positioned side by side with a metal-meshed moat structure in the scribe line. Dicing of such structures typically involves laser scribing of the moat area to minimize die damage during the saw cut process. However, as described above, silicon bridge technology may not be amenable to use of side by side guard rings together with a moat since laser scribing due to the presence of relatively thick copper metal layers. Furthermore, laser scribing processing in general can be very expensive.

In accordance with one or more embodiments described herein, a frame design for a wafer of silicon bridges dies includes, for each individual die, a first (outer) guard ring in close proximity to a saw cut area, providing initial protection during dicing. A second (inner) guard ring is located around the die edge. A staggered metal array is placed between the inner and outer guard rings. One or more cracks that propagate through the outer guard ring during (or after) a singulation process may be terminated in the staggered metal array located between the inner and outer guard rings.

Providing a high level overview of the concepts described herein, FIG. 1A illustrates a cross-sectional view of a semiconductor package having an Embedded Multi-die Interconnect Bridge (EMIB) connecting two dies, in accordance with an embodiment of the present invention. Referring to FIG. 1A, a semiconductor package 100 includes a first die 102 (e.g., a memory die) and a second die 104 (e.g., a logic, CPU or SoC die). The first die 102 and second die 104 are coupled to a silicon bridge 106 through bumps 108A and 110A of the first die 102 and second die 104, respectively, and bond pads 112A and 112B (also referred to as conductive pads 112A and 112B) of the silicon bridge 106, e.g., by thermal compression bonding (TCB).

Figure 1B:
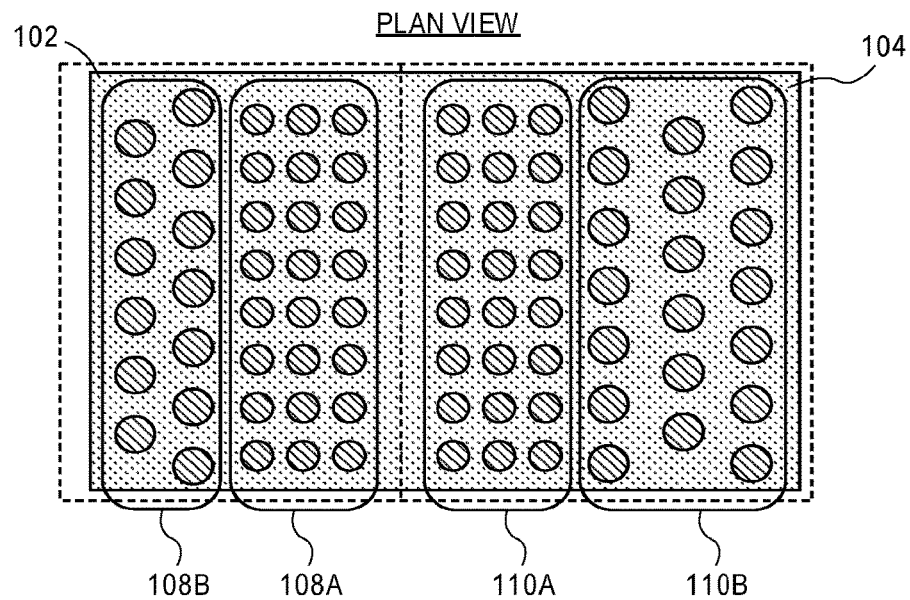
FIG. 1B illustrates a plan view showing the bump arrays of the first and second dies of FIG. 1A, in accordance with an embodiment of the present invention.

The first die 102 and second die 104 are disposed on a package substrate 114. The package substrate 114 includes metallization layers 116 (e.g., vertical arrangement of lines and vias) formed in insulating layers 118. The metallization layers 116 layers may be simple or complex and may be for coupling to other packages or may form part or all of an organic package or printed circuit board (PCB), etc. The first die 102 and second die 104 may each be coupled directly to the package substrate 114 through bumps 108B and 110B, respectively, as is depicted in FIG. 1A. FIG. 1B illustrates a plan view showing the bump arrays 108A, 108B, 110A and 110B of the first 102 and second 104 dies of FIG. 1A.

Referring again to FIG. 1A, the silicon bridge 106 as depicted is referred to as an Embedded Multi-die Interconnect Bridge (EMIB) since it is included with the layers of the package substrate 114. In another embodiment, such a silicon bridge 106 is not embedded in the package, but rather in an open cavity of a substrate or board. In either case, in an embodiment, and as will be described in greater detail below, the silicon bridge 106 includes a silicon substrate having an insulating layer disposed thereon, the silicon substrate having a perimeter 119. A metallization structure is disposed on the insulating layer, the metallization structure including conductive routing disposed in a dielectric material stack. A first metal guard ring is disposed in the dielectric material stack and surrounds the conductive routing. A second metal guard ring is disposed in the dielectric material stack and surrounds the first metal guard ring. A metal-free region 120 of the dielectric material stack surrounds the second metal guard ring. The metal-free region 120 is disposed adjacent to the second metal guard ring and adjacent to the perimeter 119 of the silicon substrate. In one embodiment, the silicon substrate of the silicon bridge 106 is free from having semiconductor devices disposed therein (i.e., the silicon bridge provides routing layers only, and not active semiconductor devices).

In one embodiment, at least one of the first metal guard ring or the second metal guard ring of the silicon bridge 106 provides a hermetic seal for the metallization structure of the silicon bridge. In one embodiment, the silicon bridge 106 further includes metal features disposed in the dielectric material stack, between the first metal guard ring and the second metal guard ring, the metal features including a feature such as, but not limited to, an alignment mark, a dummy feature, or a test feature. In one embodiment, at least one of the first metal guard ring or the second metal guard ring of the silicon bridge 106 includes a vertical stack of alternating metal lines and vias aligned along a common axis.

Referring again to FIG. 1A, the first 102 and second 104 adjacent semiconductor dies are disposed on the semiconductor package substrate 114 and electrically coupled to one another by the conductive routing of the metallization structure of the silicon bridge 106. In one embodiment, the first semiconductor die 102 is a memory die, and the second semiconductor die 104 is a logic die. The first semiconductor die 102 is attached to the first plurality of conductive pads 112A of the silicon bridge 106, and the second semiconductor die 104 is attached to the second plurality of conductive pads 112B of the silicon bridge 106. In one embodiment, the conductive routing of the silicon bridge 106 electrically couples the first plurality of conductive pads 112A with the second plurality of conductive pads 112B. In one embodiment, the first 112A and second 112B pluralities of conductive pads of the silicon bridge 106 include a layer of copper having a thickness of greater than approximately 5 microns.

As described above, a plurality of silicon bridge dies may be fabricated on a common silicon wafer which ultimately requires dicing to provide singulated silicon bridge dies. As an example, FIG. 2 illustrates a plan view of a portion of a silicon wafer having a plurality of silicon bridge dies fabricated thereon, in accordance with an embodiment of the present invention.

Figure 2:
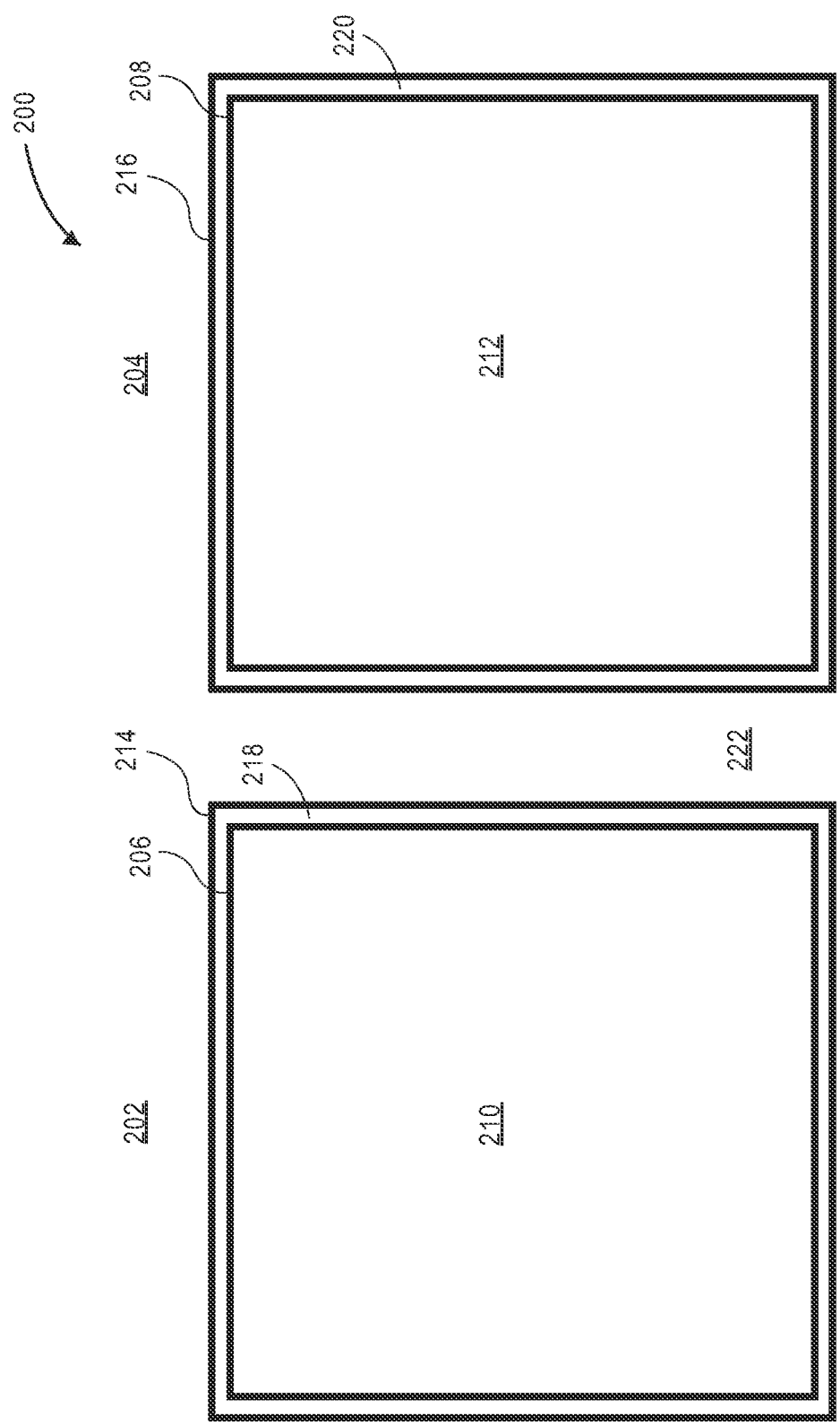
FIG. 2 illustrates a plan view of a portion of a silicon wafer having a plurality of silicon bridge dies fabricated thereon, in accordance with an embodiment of the present invention.

Referring to FIG. 2, a portion 200 of a silicon wafer includes a first silicon bridge die 202 and a second silicon bridge die 204 thereon. A first metal guard ring 206 or 208 surrounds an active region 210 or 212 of the first 202 and second 204 silicon bridge dies, respectively. A second metal guard ring 214 or 216 surrounds the first metal guard ring 206 or 208, respectively. A region 218 or 220 for various metallization features is included between the first guard ring 206 or 208 and the second guard ring 214 or 216, respectively, as will be described in greater detail below. A metal-free scribe line 222 separates the first 202 and second 204 silicon bridge dies, outside the second guard rings 214 or 216, respectively. It is noted that in FIG. 2, only two silicon bridge dies are depicted. However, it is to be appreciated that a wafer or reticle can include a greater number of silicon bridge dies depending upon the wafer or reticle size and depending on the die size.

In an embodiment, the active die region 210 or 212 of FIG. 2 include all of the signal and power/ground interconnects, allowing metal-free scribe line 222 in the dicing streets between dies. As a more detailed example, FIG. 3 illustrates an exemplary layout for adjacent silicon bridge dies on a common substrate or wafer, in accordance with an embodiment of the present invention.

Figure 3:
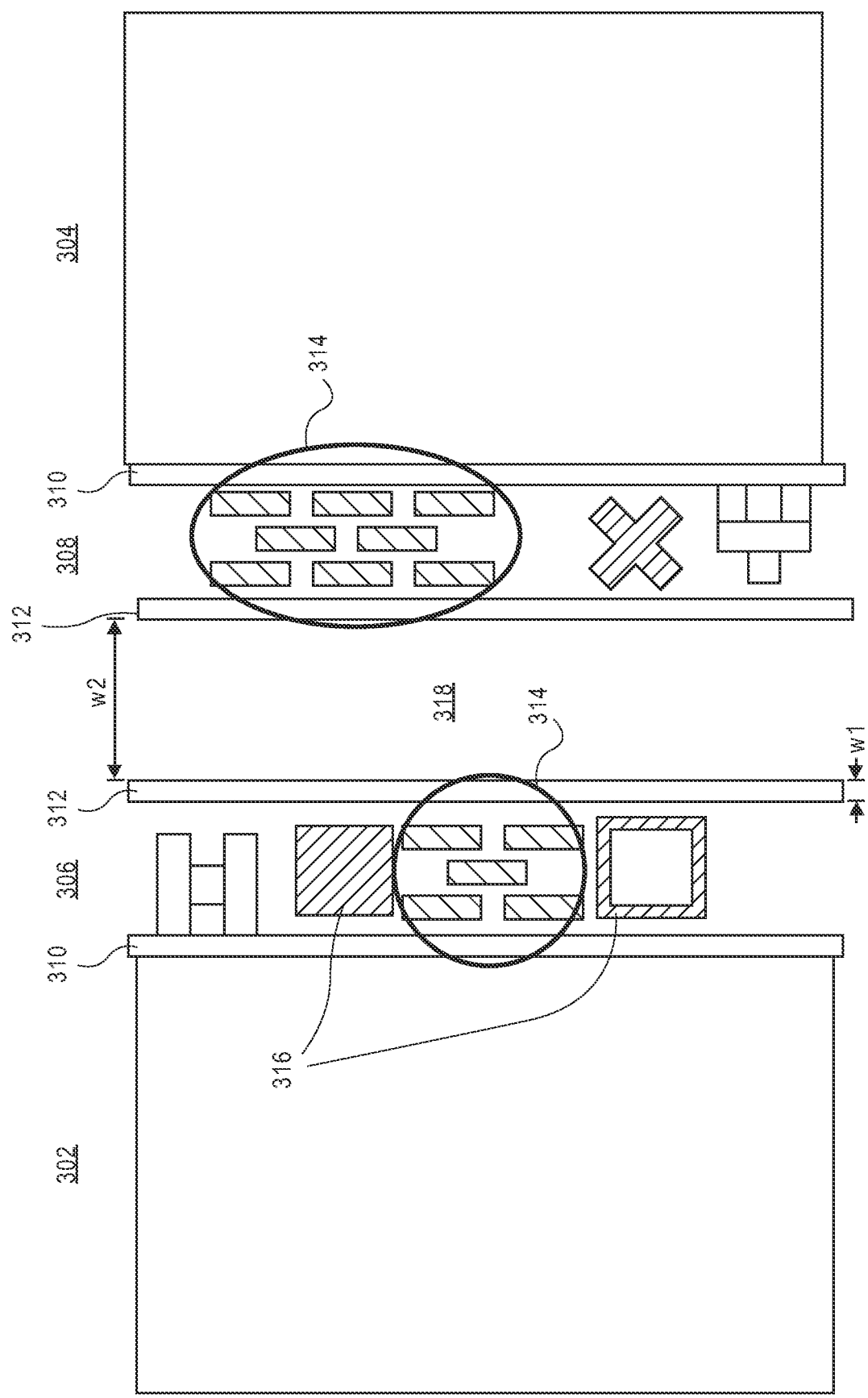
FIG. 3 illustrates an exemplary layout for adjacent silicon bridge dies on a common substrate or wafer, in accordance with an embodiment of the present invention.

Referring to FIG. 3, a portion 300 of a layout for a plurality of silicon bridge dies on a common wafer or reticle is depicted. The portion 300 shown includes portions of first and second silicon bridge dies 302 and 304. An outer edge 306 or 308 for each of the dies 302 or 304, respectively, is also depicted. It is to be appreciated that the full scale layout includes the outer edge surrounding the entire outer periphery of the first and second dies 302 and 304. Each of the outer edges 306 and 308 includes an inner metal guard ring 310 and an outer metal guard ring 312. In a particular embodiment, each guard ring has a width (W1) of approximately 2 microns, and the spacing between the inner metal guard ring 310 and the outer metal guard ring 312 is approximately in the range of 60-70 microns.

Metal features may be included between the inner metal guard ring 310 and the outer metal guard ring 312. For example, in one embodiment, staggered dummy metal features 314 (also referred to herein as mini guard rings) are included between the inner metal guard ring 310 and the outer metal guard ring 312 (as described in association with FIG. 4). In one embodiment, lithographic alignment marks 316 are included between the inner metal guard ring 310 and the outer metal guard ring 312. In an embodiment, a metal-free scribe line 318 is between the outer guard rings 312 of adjacent dies 302 and 304. In a particular such embodiment, the metal-free scribe line 318 has a width (W2) approximately in the range of 40-50 microns.

Referring again to FIG. 3, in an embodiment, such a dual guard ring frame design for each die 302 and 304 enables a saw-only die singulation process for silicon bridge technology. The metal-free scribe line 318 width is suitable to permit a saw blade cut silicon and dielectric layers (such as silicon oxide layers) without contacting copper (Cu) metal features. In an embodiment, as described above, the inner metal guard ring 310 and the outer metal guard ring 312 are spaced by staggered mini guard rings for maximum protection. Additionally, in an embodiment, the inner metal guard ring 310 and the outer metal guard ring 312 provide a hermetic seal for electrical routing included in the so-called "active" region of the dies 302 and 304.

As described above, the guard ring designs described herein may be suitable for arresting propagation of a crack formed during or after singulation of a plurality of silicon bridge dies on a common wafer or reticle. In an example, FIG. 4 illustrates a magnified plan view of a portion of a silicon bridge die including a crack formed therein, in accordance with an embodiment of the present invention.

Figure 4:
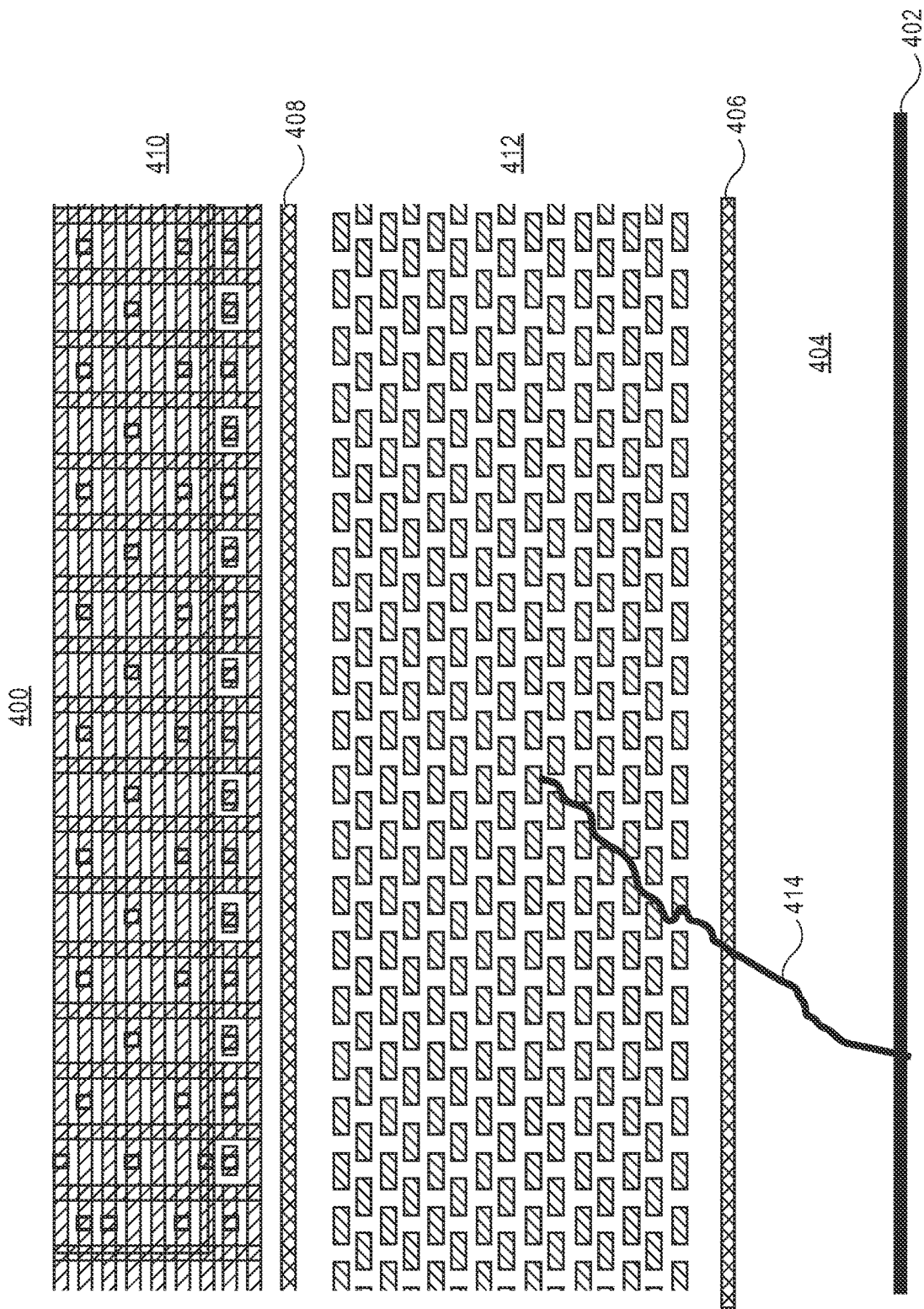
FIG. 4 illustrates a magnified plan view of a portion of a silicon bridge die including a crack formed therein, in accordance with an embodiment of the present invention.

Referring to FIG. 4, a portion 400 of die is depicted showing a die edge 402. The die edge 402 is the end of the die during/after singulation. A dual metal guard ring structure includes an outer guard ring 406 and an inner guard ring 408. A metal-free zone 404 is included between the die edge 402 and the outer guard ring 406. The guard rings protect "active" area 410 of die 400, which includes metallization/routing, e.g., for die-die communication through silicon bridge die 410. Dummy metal features 412, such as "mini" guard rings, included between guard rings 406 and 408. Although not depicted, other features such as alignment marks, may be included between guard rings 406 and 408. In accordance with an embodiment of the present invention, a die crack 414 forms during or after die singulation. As shown, die crack 414 can be initiated from the die edge 402. The die crack 414 can be stopped by the outer guard ring 406. However, if not arrested by the outer guard ring 406, the crack is ultimately arrested by the dummy metal features 412 before reaching inner guard ring 408. That is, in an embodiment, crack propagation is minimized with the dual metal guard ring frame design, which may be applicable for a saw-only singulation process for singulating silicon bridge dies.

Figure 5:
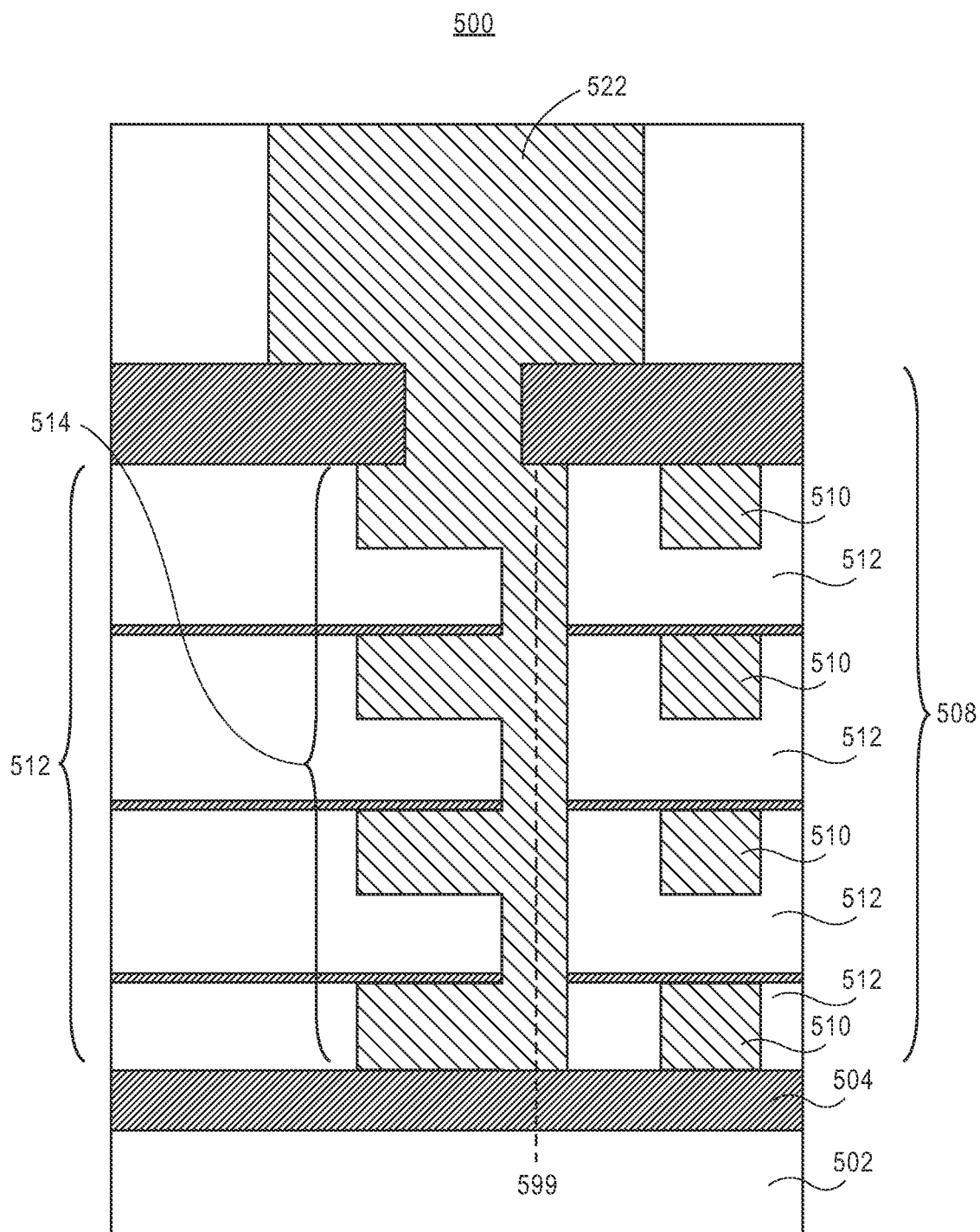
FIG. 5 illustrates a cross-sectional view of a guard ring of a dual guard ring structure, in accordance with an embodiment of the present invention.
Figure 6:
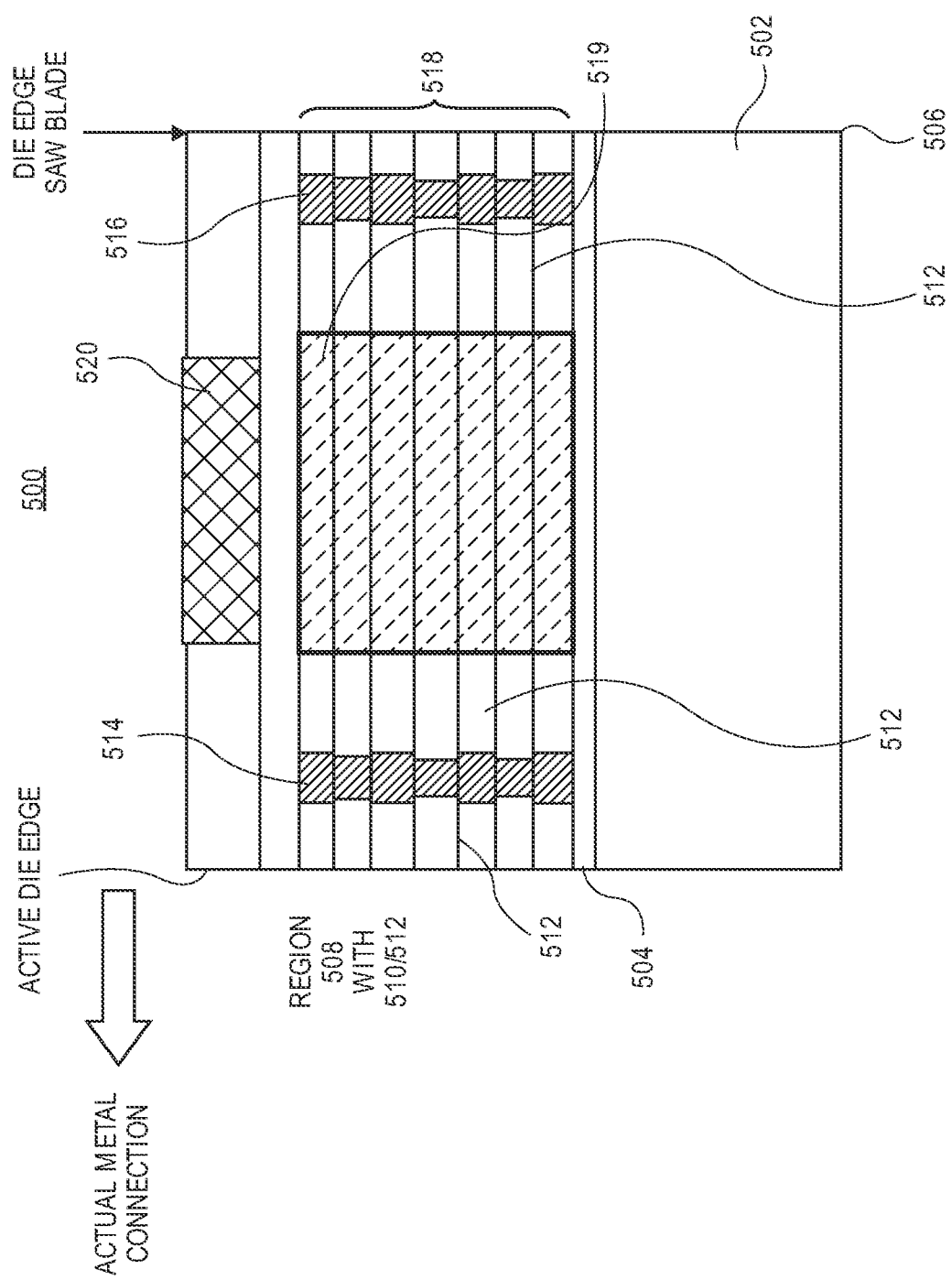
FIG. 6 illustrates a cross-sectional view of a dual guard ring structure, in accordance with an embodiment of the present invention.

A dual guard ring structure may be fabricated from a plurality of layers of a metallization structure, such as from a plurality of alternating metal lines and vias. As an example, FIG. 5 illustrates a cross-sectional view of a guard ring of a dual guard ring structure, in accordance with an embodiment of the present invention. FIG. 6 illustrates a cross-sectional view of a dual guard ring structure, in accordance with an embodiment of the present invention.

Referring to FIGS. 5 and 6 collectively, in an embodiment, a semiconductor structure 500 (such as a silicon bridge) includes a substrate 502 having an insulating layer disposed thereon 504. The substrate has a perimeter 506, an outer most portion of which is depicted on the right-hand side of FIG. 6. A metallization structure 508 is disposed on the insulating layer 504. The metallization structure 508 includes conductive routing 510 disposed in a dielectric material stack 512.

A first metal guard ring 514 is disposed in the dielectric material stack 512 and surrounds the conductive routing 510. A second metal guard ring 516 (only shown in FIG. 6) is disposed in the dielectric material stack 512 and surrounds the first metal guard ring 514. A metal-free region 518 of the dielectric material stack 512 surrounds the second metal guard ring 516 (only shown in FIG. 6). The metal-free region 516 is disposed adjacent to the second metal guard ring 516 and adjacent to the perimeter 506 of the substrate 502.

In one embodiment, at least one of the first metal guard ring or the second metal guard ring 514 or 516 provides a hermetic seal for the metallization structure 508. In one embodiment, the semiconductor structure includes metal features 519 disposed in the dielectric material stack, between the first metal guard ring 514 and the second metal guard ring 516. Additionally, an e-test pad 520 may be included between the first metal guard ring 514 and the second metal guard ring 516, as is depicted in FIG. 6. Thus, the metal features include a feature such as, but not limited to, an alignment mark, a dummy feature, or a test feature. In one embodiment, at least one of the first metal guard ring or the second metal guard ring includes a vertical stack of alternating metal lines and vias aligned along a common axis 599, as is depicted in FIG. 5. In one embodiment, an uppermost layer of the metallization structure includes first and second pluralities of conductive pads thereon, such as pad 522 shown in FIG. 5 (although it is to be appreciated that the pad may be omitted from the guard ring structure even if included in the metallization of the active die region). In one such embodiment, the conductive routing electrically couples the first plurality of conductive pads with the second plurality of conductive pads. In one embodiment, the first and second pluralities of conductive pads include a layer of copper having a thickness of greater than approximately 5 microns.

In an embodiment, the substrate 502 is free from having semiconductor devices disposed therein. That is, the primary function of the silicon bridge die is to provide local and direct communication between two dies coupled to the silicon bridge die. In one embodiment, the substrate is a single crystalline silicon substrate. In one embodiment, the semiconductor structure further includes a crack disposed in the metal-free region of the dielectric material stack and propagating through the second metal guard ring but not through the first metal guard ring, as was described above in association with FIG. 4.

Figure 7:
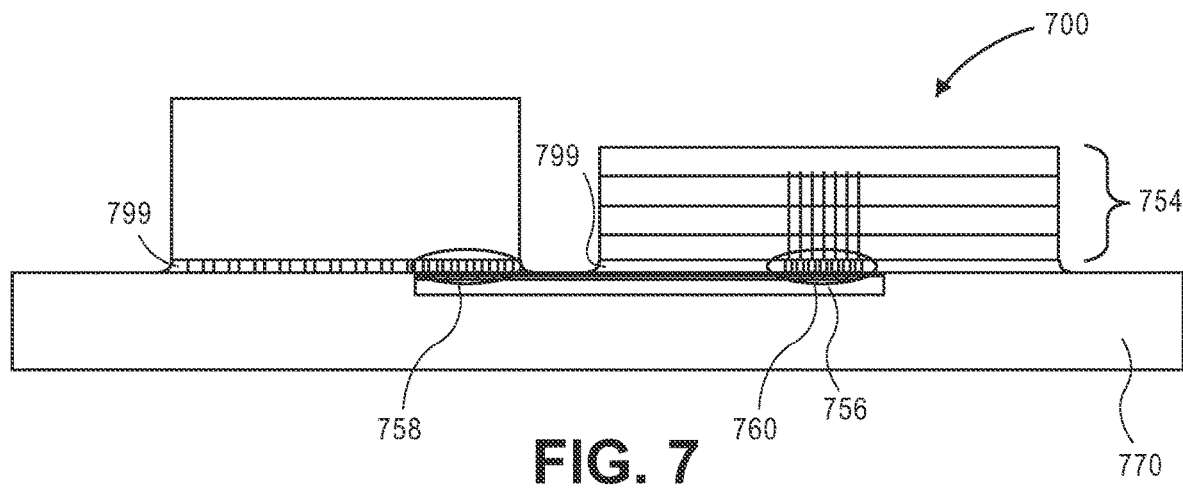
FIG. 7 illustrates a cross-sectional view of a semiconductor package including multiple die coupled with an embedded multi-die interconnect bridge (EMIB), in accordance with an embodiment of the present invention.

Although the above describe embodiments are directed to two individual dies coupled to one another by a silicon bridge or EMIB, it is to be appreciated that complex structure may also benefit from embodiments described herein. In a first example, FIG. 7 illustrates a cross-sectional view of a semiconductor package including multiple die coupled with an embedded multi-die interconnect bridge (EMIB) in accordance with an embodiment of the present invention. Referring to FIG. 7, the semiconductor package 700 includes a first die 752 (such as a logic die central processing unit, CPU) and a memory die stack 754. The first die 752 and the memory die stack 754 are coupled to an EMIB 756 through bumps 758 and 760 of the first die 752 and the memory die stack 754, respectively, e.g., by thermal compression bonding (TCB). The EMIB 756 is embedded in a substrate (e.g., a flexible organic substrate) or board (such as an epoxy PCB material) material 770. An underfill material 799 may be included between the first die 752 and the EMIB 756/substrate 770 interface and between the memory die stack 754 and the EMIB 756/substrate 770 interface, as is depicted in FIG. 7. In an embodiment, the EMIB 756 includes a dual metal guard ring surrounded by a metal free portion outside of the outermost metal guard ring, as described above.

Figure 8:
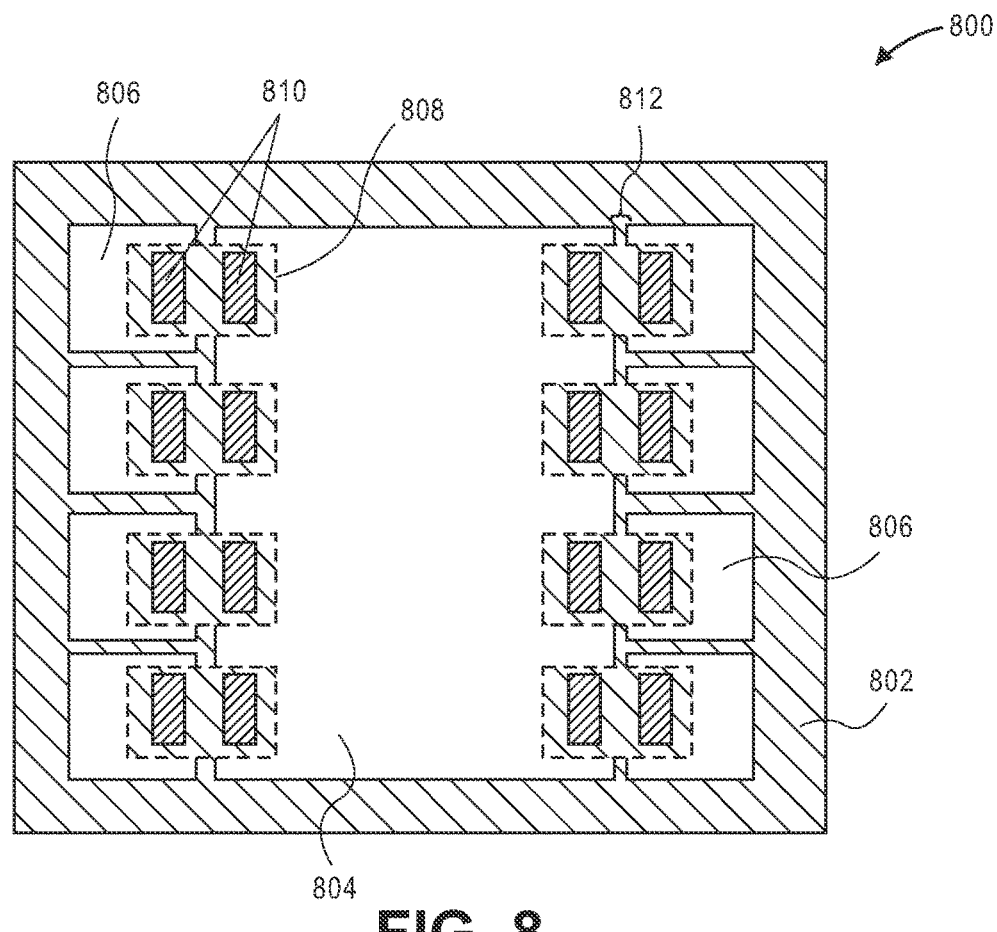
FIG. 8 illustrates a plan view of a package layout for co-packaged high performance computing (HPC) die and high bandwidth memory (HBM) layout, in accordance with an embodiment of the present invention.

In a second example, FIG. 8 illustrates a plan view of a package layout for co-packaged high performance computing (HPC) die and high bandwidth memory (HBM) layout, in accordance with an embodiment of the present invention. Referring to FIG. 8, a package layout 800 includes a common substrate 802. A central processing unit or system-on-chip (CPU/SoC) die 804 is supported by the substrate 802 along with eight memory dies 806. A plurality of EMIBs 808 bridge the memory dies 806 to the CPU/SoC die 804 by C4 connections 810. The die-to-die spacing 812 is approximately 100-200 microns. It is to be appreciated that, from a top-down view perspective, the dies 804 and 806 are disposed above the C4 connections 810, which are disposed above the EMIBs 808, which are included in the substrate 802. In an embodiment, one or more of the EMIBs 808 includes a dual metal guard ring surrounded by a metal free portion outside of the outermost metal guard ring, as described above.

As described above, in an embodiment, a substrate for a silicon bridge may be a single crystalline silicon substrate. In other embodiments, and still in the context of a "silicon bridge," the substrate may be composed of a multi- or single-crystal of a material which may include, but is not limited to, germanium, silicon-germanium or a Group III-V compound semiconductor material. In another embodiment, a glass substrate is used.

Referencing the above description regarding silicon bridge technology, in an embodiment, an insulating, dielectric or interlayer dielectric (ILD) material is one such as, but not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The insulating, dielectric or interlayer dielectric (ILD) material may be formed by conventional techniques, such as, for example, chemical vapor deposition (CVD), physical vapor deposition (PVD), or by other deposition methods.

Referencing the above description regarding silicon bridge technology, in an embodiment, interconnect or conductive routing material is composed of one or more metal or other conductive structures. A common example is the use of copper lines and structures (such as vias) that may or may not include barrier layers between the copper and surrounding ILD material. As used herein, the term metal includes alloys, stacks, and other combinations of multiple metals. For example, the metal interconnect lines may include barrier layers, stacks of different metals or alloys, etc. The interconnect lines or conductive routing are also sometimes referred to in the arts as traces, wires, lines, metal, or simply interconnects.

Figure 9:
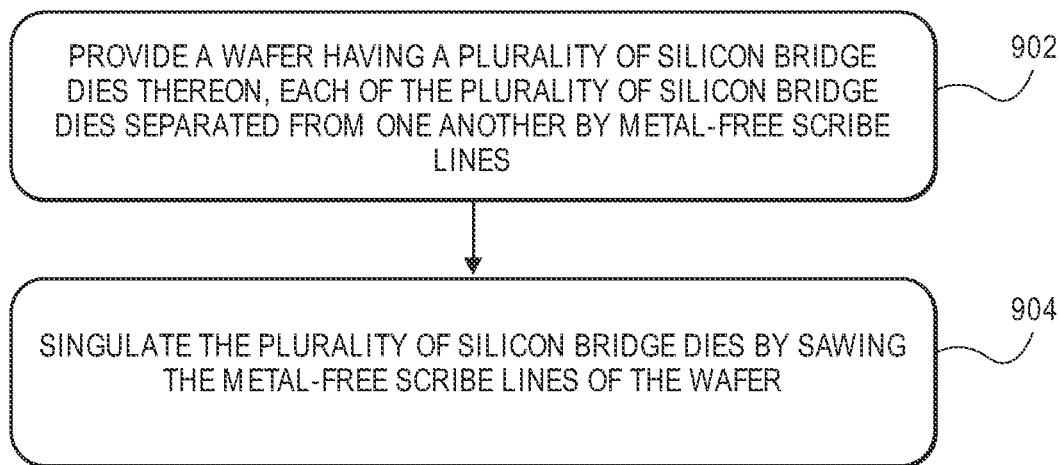
FIG. 9 is a flowchart illustrating operations in a method of fabricating a plurality of silicon bridge dies, in accordance with an embodiment of the present invention.

As described above, a plurality of silicon bridge dies may be fabricated from a common wafer. In an example, FIG. 9 is a flowchart 900 illustrating operations in a method of fabricating a plurality of silicon bridge dies, in accordance with an embodiment of the present invention.

Referring to operation 902 of flowchart 900, a method of fabricating a plurality of silicon bridge dies includes providing a wafer having a plurality of silicon bridge dies thereon. Each of the plurality of silicon bridge dies is separated from one another by metal-free scribe lines. In an embodiment, each of the plurality of silicon bridge dies has an uppermost metal layer having a thickness of greater than approximately 5 microns within a dual metal guard ring.

Referring to operation 904 of flowchart 900, the method of fabricating the plurality of silicon bridge dies includes singulating the plurality of silicon bridge dies by sawing the metal-free scribe lines of the wafer. In accordance with an embodiment of the present invention, each of the plurality of silicon bridge dies is protected by the dual metal guard ring during the sawing.

In one embodiment, singulating the plurality of silicon bridge dies involves leaving a portion of the metal-free scribe lines to remain as a portion of each of the singulated plurality of silicon bridge dies. In one embodiment, at least one of the metal guard rings of the dual metal guard ring provides a hermetic seal for each of the plurality of silicon bridge dies during the sawing. In one embodiment, a crack is formed during the sawing the metal-free scribe lines of the wafer. In a particular embodiment, the crack propagates through an outermost metal guard ring of the dual metal guard ring but not through an inner most metal guard ring of the dual metal guard ring, even subsequent to the sawing process. This, in an embodiment, a dual metal guard ring design having a metal-free outermost region enables a saw-only die singulation process for silicon bridge technologies. The metal free zone is provided in the scribe area and the dual guard ring with mini guard ring metal dummification may be implemented to provide maximum protection for potential die crack during or after die singulation.

Figure 10:
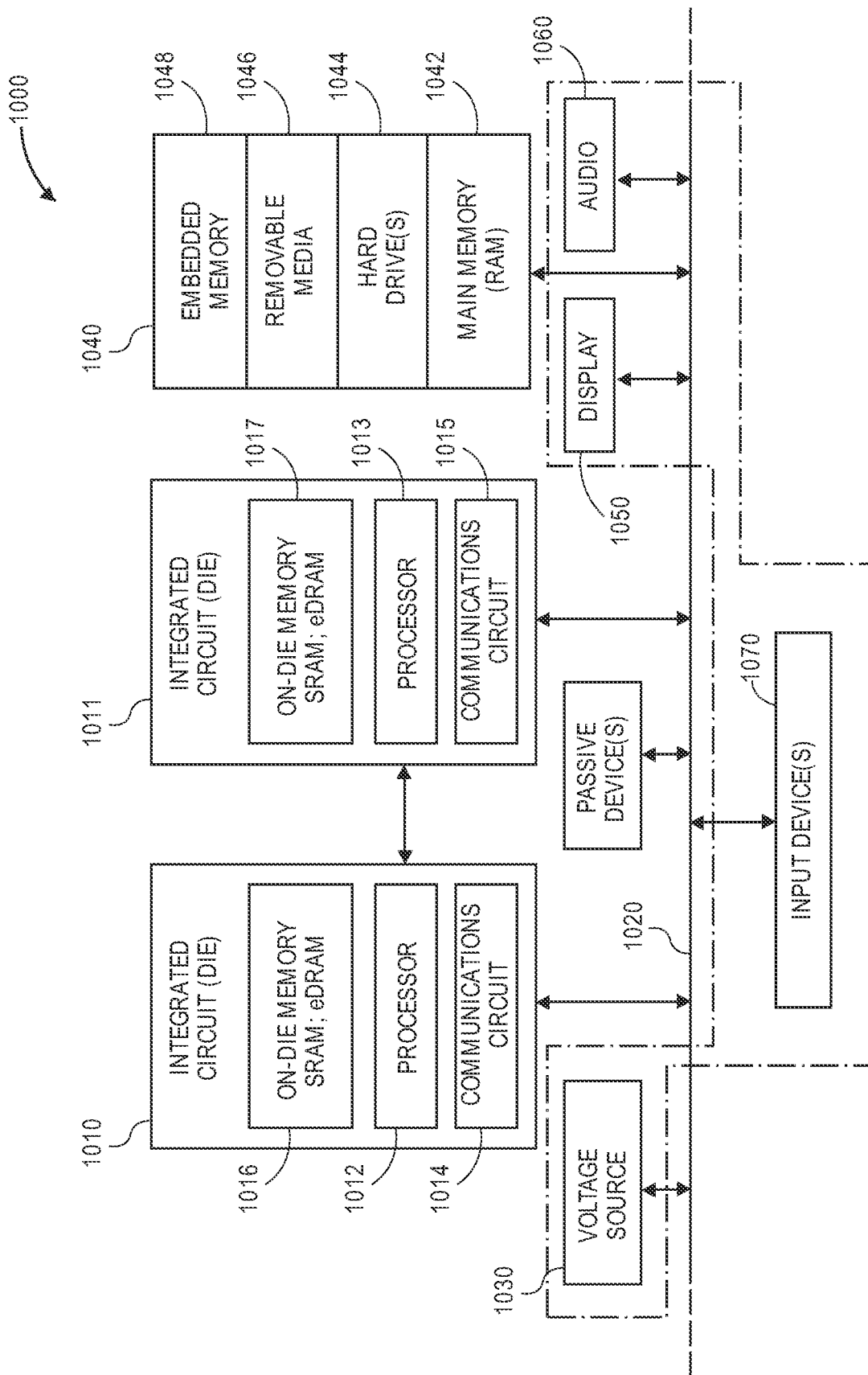
FIG. 10 is a schematic of a computer system, in accordance with an embodiment of the present invention.

FIG. 10 is a schematic of a computer system 1000, in accordance with an embodiment of the present invention. The computer system 1000 (also referred to as the electronic system 1000) as depicted can embody a silicon bridge having a metal-free frame design, according to any of the several disclosed embodiments and their equivalents as set forth in this disclosure. The computer system 1000 may be a mobile device such as a netbook computer. The computer system 1000 may be a mobile device such as a wireless smart phone. The computer system 1000 may be a desktop computer. The computer system 1000 may be a hand-held reader. The computer system 1000 may be a server system. The computer system 1000 may be a supercomputer or high-performance computing system.

In an embodiment, the electronic system 1000 is a computer system that includes a system bus 1020 to electrically couple the various components of the electronic system 1000. The system bus 1020 is a single bus or any combination of busses according to various embodiments. The electronic system 1000 includes a voltage source 1030 that provides power to the integrated circuit 1010. In some embodiments, the voltage source 1030 supplies current to the integrated circuit 1010 through the system bus 1020.

The integrated circuit 1010 is electrically coupled to the system bus 1020 and includes any circuit, or combination of circuits according to an embodiment. In an embodiment, the integrated circuit 1010 includes a processor 1012 that can be of any type. As used herein, the processor 1012 may mean any type of circuit such as, but not limited to, a microprocessor, a microcontroller, a graphics processor, a digital signal processor, or another processor. In an embodiment, the processor 1012 includes, or is coupled with, a silicon bridge having a metal-free frame design, as disclosed herein. In an embodiment, SRAM embodiments are found in memory caches of the processor. Other types of circuits that can be included in the integrated circuit 1010 are a custom circuit or an application-specific integrated circuit (ASIC), such as a communications circuit 1014 for use in wireless devices such as cellular telephones, smart phones, pagers, portable computers, two-way radios, and similar electronic systems, or a communications circuit for servers. In an embodiment, the integrated circuit 1010 includes on-die memory 1016 such as static random-access memory (SRAM). In an embodiment, the integrated circuit 1010 includes embedded on-die memory 1016 such as embedded dynamic random-access memory (eDRAM).

In an embodiment, the integrated circuit 1010 is complemented with a subsequent integrated circuit 1011. Useful embodiments include a dual processor 1013 and a dual communications circuit 1015 and dual on-die memory 1017 such as SRAM. In an embodiment, the dual integrated circuit 1010 includes embedded on-die memory 1017 such as eDRAM.

In an embodiment, the electronic system 1000 also includes an external memory 1040 that in turn may include one or more memory elements suitable to the particular application, such as a main memory 1042 in the form of RAM, one or more hard drives 1044, and/or one or more drives that handle removable media 1046, such as diskettes, compact disks (CDs), digital variable disks (DVDs), flash memory drives, and other removable media known in the art. The external memory 1040 may also be embedded memory 1048 such as the first die in a die stack, according to an embodiment.

In an embodiment, the electronic system 1000 also includes a display device 1050, an audio output 1060. In an embodiment, the electronic system 1000 includes an input device such as a controller 1070 that may be a keyboard, mouse, trackball, game controller, microphone, voice-recognition device, or any other input device that inputs information into the electronic system 1000. In an embodiment, an input device 1070 is a camera. In an embodiment, an input device 1070 is a digital sound recorder. In an embodiment, an input device 1070 is a camera and a digital sound recorder.

As shown herein, the integrated circuit 1010 can be implemented in a number of different embodiments, including a package substrate having a silicon bridge having a metal-free frame design, according to any of the several disclosed embodiments and their equivalents, an electronic system, a computer system, one or more methods of fabricating an integrated circuit, and one or more methods of fabricating an electronic assembly that includes a package substrate having a silicon bridge having a metal-free frame design, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates having a silicon bridge having a metal-free frame design embodiments and their equivalents. A foundation substrate may be included, as represented by the dashed line of FIG. 10. Passive devices may also be included, as is also depicted in FIG. 10.

Embodiments of the present invention include metal-free frame designs for silicon bridges for semiconductor packages and the resulting silicon bridges and semiconductor packages.

In an embodiment, a semiconductor structure includes a substrate having an insulating layer disposed thereon, the substrate having a perimeter. A metallization structure is disposed on the insulating layer, the metallization structure including conductive routing disposed in a dielectric material stack. A first metal guard ring is disposed in the dielectric material stack and surrounds the conductive routing. A second metal guard ring is disposed in the dielectric material stack and surrounds the first metal guard ring. A metal-free region of the dielectric material stack surrounds the second metal guard ring. The metal-free region is disposed adjacent to the second metal guard ring and adjacent to the perimeter of the substrate.

In one embodiment, at least one of the first metal guard ring or the second metal guard ring provides a hermetic seal for the metallization structure.

In one embodiment, the semiconductor structure includes metal features disposed in the dielectric material stack, between the first metal guard ring and the second metal guard ring. The metal features include a feature selected from the group consisting of an alignment mark, a dummy feature, and a test feature.

In one embodiment, at least one of the first metal guard ring or the second metal guard ring includes a vertical stack of alternating metal lines and vias aligned along a common axis.

In one embodiment, an uppermost layer of the metallization structure includes first and second pluralities of conductive pads thereon.

In one embodiment, the conductive routing electrically couples the first plurality of conductive pads with the second plurality of conductive pads.

In one embodiment, the first and second pluralities of conductive pads include a layer of copper having a thickness of greater than approximately 5 microns.

In one embodiment, the substrate is free from having semiconductor devices disposed therein.

In one embodiment, the substrate is a single crystalline silicon substrate.

In one embodiment, the semiconductor structure further includes a crack disposed in the metal-free region of the dielectric material stack and propagating through the second metal guard ring but not through the first metal guard ring.

In an embodiment, a method of fabricating a plurality of silicon bridge dies includes providing a wafer having a plurality of silicon bridge dies thereon. Each of the plurality of silicon bridge dies is separated from one another by metal-free scribe lines. The method also includes singulating the plurality of silicon bridge dies by sawing the metal-free scribe lines of the wafer. Each of the plurality of silicon bridge dies is protected by a dual metal guard ring during the sawing.

In one embodiment, singulating the plurality of silicon bridge dies involves providing a plurality of silicon bridge dies having an uppermost metal layer having a thickness of greater than approximately 5 microns within the dual metal guard ring.

In one embodiment, singulating the plurality of silicon bridge dies involves leaving a portion of the metal-free scribe lines to remain as a portion of each of the singulated plurality of silicon bridge dies.

In one embodiment, at least one of the metal guard rings of the dual metal guard ring provides a hermetic seal for each of the plurality of silicon bridge dies during the sawing.

In one embodiment, sawing the metal-free scribe lines of the wafer further involves forming a crack in one of the metal-free scribe lines, the crack propagating through an outermost metal guard ring of the dual metal guard ring but not through an inner most metal guard ring of the dual metal guard ring.

In an embodiment, a semiconductor package includes an embedded multi-die interconnect bridge (EMIB) including a silicon bridge disposed within a semiconductor package substrate. The silicon bridge includes a silicon substrate having an insulating layer disposed thereon, the silicon substrate having a perimeter. A metallization structure is disposed on the insulating layer, the metallization structure including conductive routing disposed in a dielectric material stack. A first metal guard ring is disposed in the dielectric material stack and surrounds the conductive routing. A second metal guard ring is disposed in the dielectric material stack and surrounds the first metal guard ring. A metal-free region of the dielectric material stack surrounds the second metal guard ring. The metal-free region is disposed adjacent to the second metal guard ring and adjacent to the perimeter of the silicon substrate. The semiconductor package also includes first and second adjacent semiconductor dies disposed on the semiconductor package substrate and electrically coupled to one another by the conductive routing of the metallization structure of the silicon bridge.

In one embodiment, the first semiconductor die is a memory die, and the second semiconductor die is a logic die.

In one embodiment, at least one of the first metal guard ring or the second metal guard ring of the silicon bridge provides a hermetic seal for the metallization structure of the silicon bridge.

In one embodiment, the silicon bridge further includes metal features disposed in the dielectric material stack, between the first metal guard ring and the second metal guard ring, the metal features including a feature such as, but not limited to, an alignment mark, a dummy feature, or a test feature.

In one embodiment, at least one of the first metal guard ring or the second metal guard ring of the silicon bridge includes a vertical stack of alternating metal lines and vias aligned along a common axis.

In one embodiment, an uppermost layer of the metallization structure of the silicon bridge includes first and second pluralities of conductive pads thereon. The first semiconductor die is attached to the first plurality of conductive pads, and the second semiconductor die is attached to the second plurality of conductive pads.

In one embodiment, the conductive routing of the silicon bridge electrically couples the first plurality of conductive pads with the second plurality of conductive pads.

In one embodiment, the first and second pluralities of conductive pads of the silicon bridge include a layer of copper having a thickness of greater than approximately 5 microns.

In one embodiment, the silicon substrate is free from having semiconductor devices disposed therein.

In one embodiment, the silicon bridge further includes a crack disposed in the metal-free region of the dielectric material stack of the silicon bridge and propagating through the second metal guard ring but not through the first metal guard ring of the silicon bridge.

What is claimed is:

1. A semiconductor structure, comprising:
   a substrate having an insulating layer thereon, the substrate having a perimeter, and the substrate comprising silicon;
   a metallization structure on the insulating layer, the metallization structure comprising conductive routing in a dielectric material stack;
   a first metal ring in the dielectric material stack and continuous around the conductive routing;
   a second metal ring in the dielectric material stack and continuous around the first metal ring, wherein at least one of the first metal ring or the second metal ring comprises a vertical stack of alternating metal lines and vias, the alternating metal lines comprising a first metal line, a second metal line above the first metal line, a third metal line above the second metal line, and a fourth metal line above the third metal line;
   a plurality of staggered non-continuous metal rings between the first metal ring and the second metal ring; and a metal-free region of the dielectric material stack surrounding the second metal ring, the metal-free region adjacent to the second metal ring and adjacent to the perimeter of the substrate.

2. The semiconductor structure of claim 1, wherein at least one of the first metal ring or the second metal ring provides a hermetic seal for the metallization structure.

3. The semiconductor structure of claim 1, further comprising:
a metal feature between the first metal ring and the second metal ring, the metal feature selected from the group consisting of an alignment mark, a dummy feature, and a test feature.

4. The semiconductor structure of claim 1, wherein an uppermost layer of the metallization structure comprises first and second pluralities of conductive pads thereon.

5. The semiconductor structure of claim 4, wherein the conductive routing electrically couples the first plurality of conductive pads with the second plurality of conductive pads.

6. The semiconductor structure of claim 4, wherein the first and second pluralities of conductive pads comprise a layer of copper having a thickness of greater than approximately 5 microns.

7. The semiconductor structure of claim 1, wherein the substrate is free from having semiconductor devices therein.

8. The semiconductor structure of claim 1, wherein the substrate is a single crystalline silicon substrate.

9. The semiconductor structure of claim 1, further comprising:
a crack in the metal-free region of the dielectric material stack, the crack propagating through the second metal ring but not through the first metal ring.

10. A semiconductor package, comprising:
an embedded interconnection bridge comprising a bridge within a semiconductor package substrate, the bridge comprising:
a substrate having an insulating layer thereon, the substrate having a perimeter, and the substrate comprising silicon;
a metallization structure on the insulating layer, the metallization structure comprising conductive routing in a dielectric material stack;
a first metal ring in the dielectric material stack and continuous around the conductive routing;
a second metal ring in the dielectric material stack and continuous around the first metal ring, wherein at least one of the first metal ring or the second metal ring of the bridge comprises a vertical stack of alternating metal lines and vias, the alternating metal lines comprising a first metal line, a second metal line above the first metal line, a third metal line above the second metal line, and a fourth metal line above the third metal line;
a plurality of staggered non-continuous metal rings between the first metal ring and the second metal ring; and
a metal-free region of the dielectric material stack surrounding the second metal ring, the metal-free region adjacent to the second metal ring and adjacent to the perimeter of the substrate;
a first semiconductor die on the semiconductor package substrate; and
a second semiconductor die on the semiconductor package substrate and adjacent the first semiconductor die, the second semiconductor die electrically coupled to the first semiconductor die by the conductive routing of the metallization structure of the bridge.

11. The semiconductor package of claim 10, wherein the first semiconductor die is a memory die, and the second semiconductor die is a logic die.

12. The semiconductor package of claim 10, wherein at least one of the first metal ring or the second metal ring of the bridge provides a hermetic seal for the metallization structure of the bridge.

13. The semiconductor package of claim 10, the bridge further comprising:
a metal feature between the first metal ring and the second metal ring, the metal feature selected from the group consisting of an alignment mark, a dummy feature, and a test feature.

14. The semiconductor package of claim 10, wherein an uppermost layer of the metallization structure of the bridge comprises first and second pluralities of conductive pads thereon, wherein the first semiconductor die is attached to the first plurality of conductive pads, and wherein the second semiconductor die is attached to the second plurality of conductive pads.

15. The semiconductor package of claim 14, wherein the conductive routing of the bridge electrically couples the first plurality of conductive pads to the second plurality of conductive pads.

16. The semiconductor package of claim 14, wherein the first and second pluralities of conductive pads of the bridge comprise a layer of copper having a thickness of greater than approximately 5 microns.

17. The semiconductor package of claim 10, wherein the substrate is free from having semiconductor devices therein.

18. The semiconductor package of claim 10, the bridge further comprising:
a crack in the metal-free region of the dielectric material stack of the bridge, the crack propagating through the second metal ring but not through the first metal ring of the bridge.

* * * * *